United States Patent [19]

Hall

[11] 4,157,559

[45] Jun. 5, 1979

[54] COAXIAL NUCLEAR RADIATION DETECTOR WITH DEEP JUNCTION AND RADIAL FIELD GRADIENT

[75] Inventor: Robert N. Hall, Schenectady, N.Y.

[73] Assignee: The United States of America as represented by the United States Department of Energy, Washington, D.C.

[21] Appl. No.: 763,836

[22] Filed: Jan. 31, 1977

Related U.S. Application Data

[62] Division of Ser. No. 623,974, Oct. 20, 1974, Pat. No. 4,060,432.

[51] Int. Cl.² ............................................. H01L 27/14
[52] U.S. Cl. ........................................ 357/30; 357/29; 357/55; 357/89
[58] Field of Search ......................... 357/30, 89, 55, 29

[56] References Cited

U.S. PATENT DOCUMENTS

| | | | |
|---|---|---|---|
| 3,036,234 | 5/1962 | Dacey | 313/105 |
| 3,116,183 | 12/1963 | Pell | 148/33.5 |
| 3,122,655 | 2/1964 | Murray | 307/88.5 |
| 3,293,511 | 12/1966 | Gault | 317/235 |
| 3,461,005 | 8/1969 | Jamini | 148/186 |
| 3,976,508 | 8/1976 | Mlavsky | 136/89 |

*Primary Examiner*—Martin H. Edlow
*Attorney, Agent, or Firm*—Dean E. Carlson; Randall G. Erdley; Jerome C. Squillaro

[57] ABSTRACT

Germanium radiation detectors are manufactured by diffusing lithium into high purity p-type germanium. The diffusion is most readily accomplished from a lithium-lead-bismuth alloy at approximately 430° and is monitored by a quartz half cell containing a standard composition of this alloy.

Detectors having n-type cores may be constructed by converting high purity p-type germanium to n-type by a lithium diffusion and subsequently diffusing some of the lithium back out through the surface to create a deep p-n junction.

Coaxial germanium detectors comprising deep p-n junctions are produced by the lithium diffusion process.

18 Claims, 22 Drawing Figures

COAXIAL NUCLEAR RADIATION DETECTOR WITH DEEP JUNCTION AND RADIAL FIELD GRADIENT

This is a division of application Ser. No. 623,974, filed Oct. 20, 1974, now U.S. Pat. No. 4,060,432.

BACKGROUND OF THE INVENTION

This invention relates to solid state, nuclear radiation detectors. More specifically, this invention relates to germanium radiation detectors wherein deep p-n junctions are produced by the diffusion of lithium.

Germanium devices for the detection of gamma radiation are well known. Typically, gamma radiation is caused to impinge on a germanium body at 77° K. A p-n junction is formed within the germanium and is reverse biased with an electric field to deplete charge carriers from a volume adjoining the junction. Gamma rays impinging on the depleted region excite charge carriers and produce a current pulse across the junction.

It is desirable to produce germanium detectors having large electric fields within the depletion region. Such fields increase the drift velocity of charge carriers within the detector and thereby improve the detector pulse response time. High fields also minimize the effects of charge carrier trapping within the depletion region.

It is generally undesirable, however, to operate germanium detectors with high electric fields in the surface or contact regions. High surface fields contribute to detector noise and increase the probability of breakdown between contacts.

Prior art germanium radiation detectors have generally been produced by a lithium drifting process which is described, for example, in U.S. Pat. No. 3,016,313 to Pell. A high concentration of lithium is diffused into the surface of a body of p-type germanium to form a narrow p-n junction. The germanium is heated while a strong, reversed bias electric field is applied across the junction to drift the lithium through the structure. The electric fields in coaxial lithium drifted germanium detectors reach their highest values at the radius of the inner electrode. Drifted detectors must, generally, be stored and operated at cryogenic temperatures to prevent precipitation of the highly concentrated lithium dopant.

Germanium detectors have also been formed by producing a p-n junction at one surface of a body of high purity p-type germanium, for example, those described in *Planar and Coaxial High Purity Germanium Radiation Detectors*, J. Llacer, Nuclear Instruments of Methods, 98 (1972), 259–268. Detectors of this type are characterized by high electric field concentrations in the region of the negative contact.

Prior art planar detectors have also been produced by utilizing naturally occurring junctions within bodies of high purity germanium, for example, those described in *A Large Volume High Purity Germanium Radiation Detector*, J. Llacer, Nuclear Instruments and Methods, 104 (1972), 249–251. The geometry of such detectors is, however, limited by the occurrence and shape of the natural p-n junctions which occur in a random and unpredictable manner during germanium crystal growth.

SUMMARY OF THE INVENTION

I have determined that germanium radiation detectors may be produced by diffusing lithium into germanium crystals to produce p-n junctions deep within a germanium body. The electric field concentration in such detectors is highest in the vicinity of the junction and falls to a minimum at the detector surfaces. Detectors of this type may, therefore, be operated at high electric field intensities without exhibiting surface breakdown phenomena typical of prior art detectors. The lithium concentrations produced by the diffusion process are very small, being of the same order of magnitude as the acceptor atom concentrations in high purity germanium crystals. Detectors produced in accordance with this invention may, therefore, be stored at room temperature without suffering the effects of lithium precipitation which characterize prior art lithium drifted detectors.

The geometry of germanium radiation detectors which are produced in accordance with my lithium diffusion process may be controlled and varied. For example, deep junction detectors produced in accordance with this process may be constructed in coaxial form with either p-type or n-type germanium outermost.

It is, therefore, an object of this invention to produce germanium radiation detectors which are capable of operating with high electric field intensities.

Another object of this invention is to produce germanium radiation detectors having low electric field intensities at the crystal surface and high electric field intensities at the crystal interior.

Another object of this invention is to produce germanium radiation detectors which may be stored at room temperature.

Another object of this invention is to produce deep junction germanium radiation detectors having a coaxial or other desirable geometry.

BRIEF DESCRIPTION OF THE DRAWINGS

The novel features believed to be characteristic of the invention are set forth in the appended claims. The invention itself, together with further objects and advantages thereof, may be best understood by reference to the following description taken in connection with the appended drawings in which:

DESCRIPTION OF THE PREFERRED EMBODIMENTS

A nuclear radiation detector may be formed by applying a reverse electric field to deplete charge carriers from the volume adjoining a junction in a germanium crystal. Nuclear particles interact with the germanium crystal to produce electron-hole pairs which are swept from the depleted region by the electric field. The electron-hole flow within the detector crystal produces an electric current pulse in an external circuit which may be measured or counted to determine the nature and quantity of the nuclear radiation. The maximum counting rate possible with such a detector is in part determined by the speed with which electrons and holes are swept from the depletion region. It is, therefore, desirable to operate such a detector with the highest possible electric field strength. A high electric field strength also tends to minimize the possibility of electrons and holes being trapped at sites within the depletion region.

Prior art germanium detectors have commonly been formed by drifting lithium through p-type germanium under the influence of an electric field. The lithium atoms neutralize acceptor atoms within the germanium to create a wide p-n junction. Typically, the lithium concentration in drifted detectors is high enough (for example, $3 \times 10^{14}$ atoms/cc) to precipitate lithium within the crystal at room temperature. Drifted detectors must, therefore, at all times be stored at cryogenic temperatures to prevent such precipitation which would render the detector inoperable.

Figure 2:
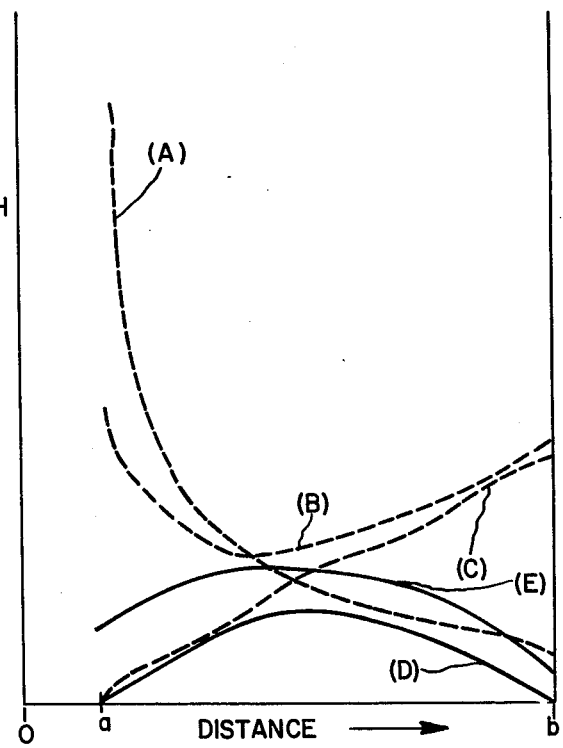
FIG. 2 graphically illustrates the electric field distribution within several types of germanium radiation detectors.

Curve A of FIG. 2 illustrates the electric field distribution within a coaxial lithium drifted detector having an inner radius a and an outer radius b; the electric field strength rises sharply to a maximum at the inner surface. The maximum voltage which may be applied to such a detector is, therefore, limited by the breakdown characteristics at the inner surface which will arc or produce noise if the voltage is increased above a critical value.

Prior art coaxial germanium detectors have also been produced from high purity germanium in accordance with the above-described method of Llacer. The surface junctions of such detectors tend to produce electric field distributions illustrated by curves B and C of FIG. 2. The electric field strength in such detectors may be seen to rise to a maximum value at the contact surfaces and tends to limit the maximum applied voltage in a manner similar to that encountered in lithium drifted detectors.

Planar detectors of the prior art have also been constructed from natural p-n junctions which occasionally occur within germanium crystals. At full depletion, the electric field strength distribution within a detector of this type is similar in shape to curve D of FIG. 2; the electric field is zero at the contact surfaces and rises to a maximum at the center of the crystal. For higher applied voltages, the electric field strength at the contacts rises (similar to curve e of FIG. 2) but still remains less than the field strength in the crystal interior. Detectors containing deep internal junctions are, therefore, relatively insensitive to the voltage limiting effects which are caused by the high electric field at the contacts of the other type detectors.

Naturally occurring p-n junctions in high purity germanium are a relatively uncontrolled phenomenon and it would be impractical to produce commercial radiation detectors of this type. The geometry of detectors containing such junctions is of course limited by the shape of the grown-in junction and could not be optimized for commercial detector applications, for example, coaxial geometries.

I have determined that junctions may be produced deep within high purity germanium crystals by a controlled diffusion of lithium into p-type germanium. The junctions produced by this method may assume a variety of geometries but, for the production of germanium detectors, are most advantageously formed in a coaxial cylindrical geometry. In the following examples of preferred embodiments of my invention the diffusion process will be described with respect to such coaxial geometries. It is to be understood, however, that my process is not so limited and may be conducted, for example, in planar or other geometries to produce detectors which are optimally shaped for special applications.

Figure 1:
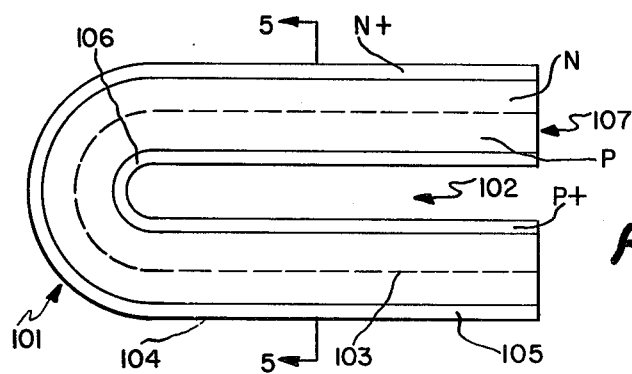
FIG. 1 is a schematic, sectional view of a coaxial radiation detector of the present invention.

FIG. 1 illustrates a typical detector produced in accordance with the present invention. The detector comprises a cylinder of germanium having a hemispherical end 101 and which is cored to produce a reentrant cavity 102. A deep p-n junction 103 is produced, in a manner more fully described below, between the outer wall of the cylinder 104 and the wall of the cavity 102. The radius of the junction 103 is typically approximately 70 percent of the outer radius of the outer wall 104. In the geometry illustrated, the outer portion of the cylinder forms the n-type contact while the inner portion of the cylinder forms a p-type contact. This geometry may, however, be reversed in a manner more fully described in later paragraphs. An n+ contact 105 covers the outer surface of the cylinder while a p+ contact 106 is applied to and covers the wall of the cavity 102. A reversed bias electric field is applied between the n+ contact 105 and the p+ contact 106 is deplete the junction 103 and operate the detector in a conventional manner. The detector is normally operated at cryogenic temperatures in a manner typical of other forms of germanium radiation detectors.

Figure 3:
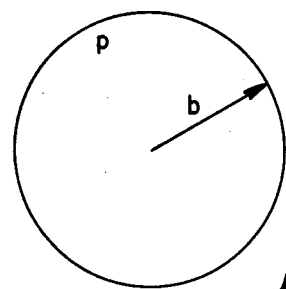
FIGS. 3, 4, and 5 illustrate sequential steps utilized in manufacturing the radiation detector of FIG. 1.
Figure 3A:
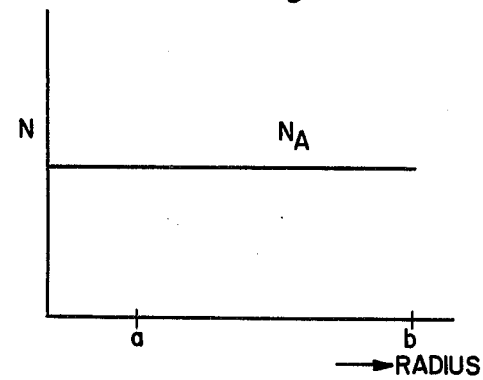
FIGS. 3a, 4a, and 5a graphically illustrate the impurity concentration within a germanium crystal during the manufacturing steps of FIGS. 3, 4, and 5.

The detectors of the present invention may be manufactured by forming a cylinder of high purity p-type germanium having an outer radius b as illustrated in the schematic sectional diagram, FIG. 3. The cylinder may be most advantageously formed with hemispherical ends and may be sectioned after diffusion to produce two detectors of the geometry illustrated in FIG. 1. The p-type germanium should be of a high purity type typically with an acceptor concentration between approximately $1 \times 10^{10}$ and approximately $5 \times 10^{10} \text{cm}^{-3}$. High purity germanium of this type may be produced in accordance with the methods of my U.S. Pat. Nos. 3,671,330 and 3,795,547. The distribution of acceptor impurities within the p-type crystal of FIG. 3 is substantially constant and is illustrated graphically in FIG. 3a.

Lithium is then diffused into the outer surface of the crystal to neutralize the acceptor carriers and produce an n-type outer region. The diffusion is most readily accomplished by immersing the germanium crystal in a molten mixture of Bi-Pb eutectic alloy containing predetermined additions of Li, for a time sufficient to produce a p-n junction at a desired depth within the crystal. Specific examples of a similar technique have been described by Kegel in *Nuclear Instruments and Methods*, 105 (1972) 381–382, which article is incorporated by reference in this specification. It should be noted, however, that Kegel describes diffusion techniques for producing shallow lithium contacts and thus utilizes much greater lithium concentrations and shorter diffusion times than those which are useful in my process. The lithium concentration in the Bi-Pb alloy is a critical factor in the practice of my diffusion process. Special techniques (described below) must be practiced to minimize lithium loss by oxidation during the preparation of the alloy and operation of the diffusion step. The concentration of lithium used in the diffusion process may be most accurately and advantageously determined by use of a lithium half cell in a manner more particularly described in the following paragraphs.

Figure 4:
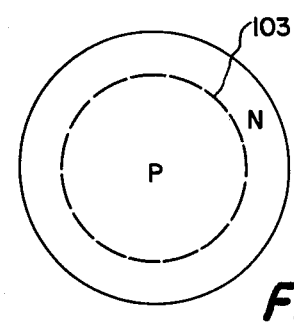
Figure 4A:
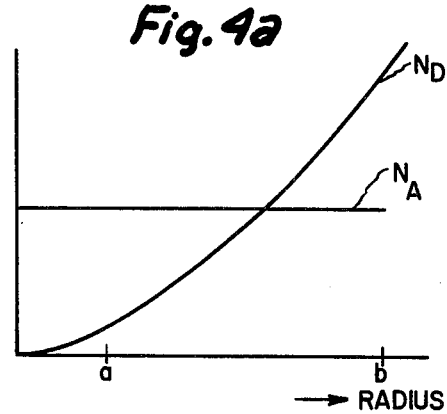

The concentration of acceptor and donor impurities within the crystal of FIG. 4 is graphically illustrated in FIG. 4a. The diffused lithium may be seen to produce a wide junction 103 of p and n type material deep within the crystal. The diffusion process parameters are calculated, using well known formulas; typically the lithium concentration at the surface of the crystal following the diffusion step should be between approximately 1.5 times and approximately four times the initial acceptor atom concentration.

Figure 5:
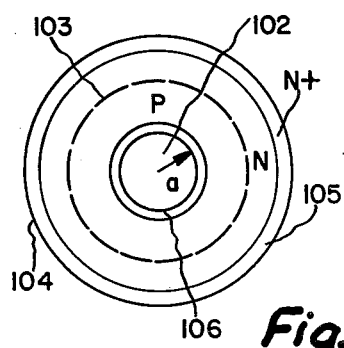

The crystal is then cut to form two detector sections and cored to produce the coaxial structure of FIG. 1 and FIG. 5. A shallow diffusion of concentrated lithium is performed on the outer surface of the cylinder to produce an n+ contact 105 in a conventional manner. An Au or Pd p+ contact 106 is similarly applied to the inner cored surface in a conventional manner. The p+ contact may also be produced by liquid epitaxial regrowth by filling the cavity with a liquid acceptor alloy, heating and recooling the crystal, and decanting the liquid metal before it solidifies. The distribution of donor and acceptor impurities within the detector of FIG. 5 is illustrated schematically in FIG. 5a.

The coaxial detector geometry of FIG. 1 is particularly advantageous for germanium detectors constructed by these methods. Only a single surface 107 of the p-n junction is exposed during the later steps of the manufacturing process. The probability of damage to the junction during final processing, finishing, and mounting steps is thereby reduced.

Figure 5A:
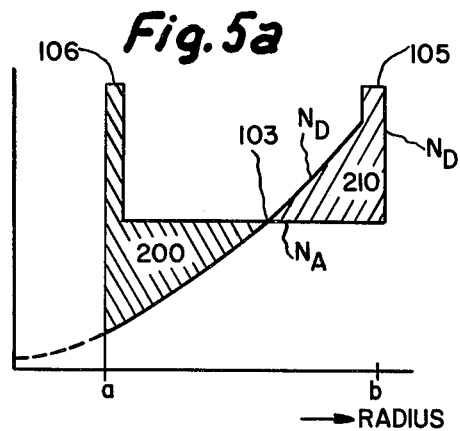

The optimal position of the p-n junction within the crystal may be determined by reference to the illustration of FIG. 5a. The junction should be positioned so that the net excess of acceptor atoms in the p region 200 is equal to the net excess of donor atoms in the n region 210.

Figure 6:
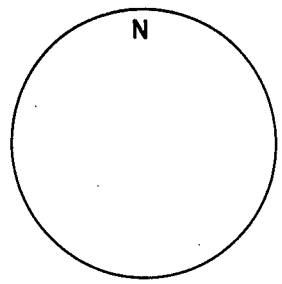
FIGS. 6, 7, and 8 illustrate sequential steps for manufacturing a coaxial radiation detector having an internal n contact.
Figure 6A:
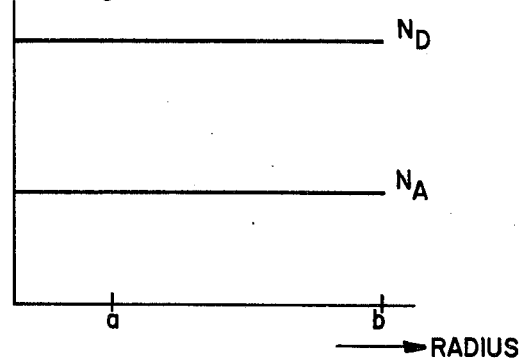
FIGS. 6a, 7a, and 8a illustrate the impurity concentrations in a germanium crystal during the manufacturing steps of FIGS. 6, 7, and 8.
Figure 7:
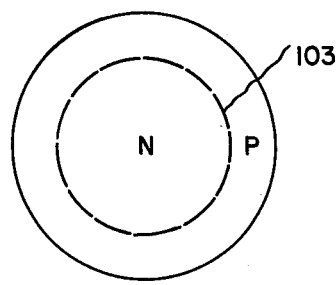
Figure 7A:
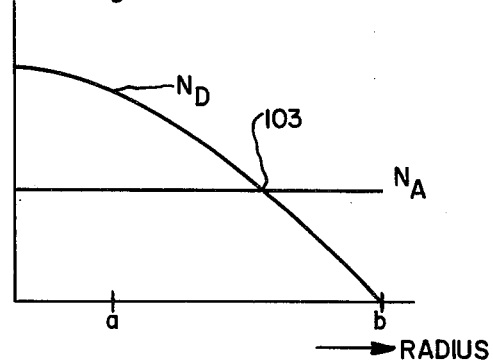
Figure 8:
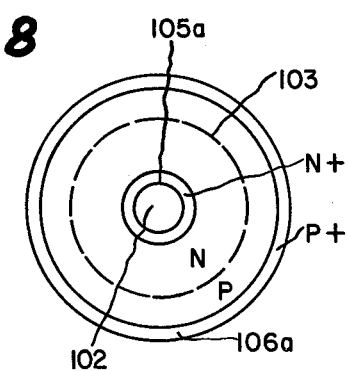
Figure 8A:
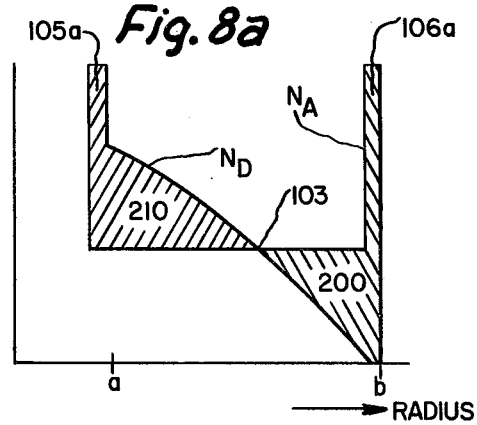

It is often more advantageous to produce a coaxial detector having an external p-type region. For example, the p+ contact may be more readily formed by any of several methods including vacuum evaporation of Au or Pd, ion implantation of B, $BF_3$ glow discharge, or solid phase epitaxy onto the outer surface of the germanium cylinder. Such a detector may be prepared by adding a small quantity of lithium during the preparation of high purity p-type germanium. The resulting crystal will be n-type as illustrated in FIG. 6 and will be characterized by a uniform acceptor impurity concentration and a somewhat greater, uniform donor concentration illustrated in FIG. 6a. Lithium from the surface of the crystal is then diffused out into a lead bismuth alloy bath at approximately 400° C. for a predetermined time in a manner which is described in my U.S. Pat. No. 3,795,547. The resulting structure and impurity concentrations are illustrated in FIG. 7 and FIG. 7a. The crystal is then cored and p+ 106a and n+ 105a contacts are applied in a conventional manner (FIG. 8). The resulting impurity concentrations are indicated in FIG. 8a. As in the previous example, junction 103 position should be determined so that the net acceptors 200 in the p region equals the net donors 210 in the n region.

Figure 10:
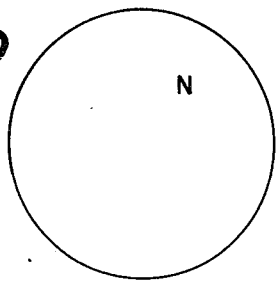
FIGS. 9, 10, 11, and 12 illustrate the steps for an alternate, preferred method for manufacturing a coaxial radiation detector having an n-contact innermost.
Figure 10A:
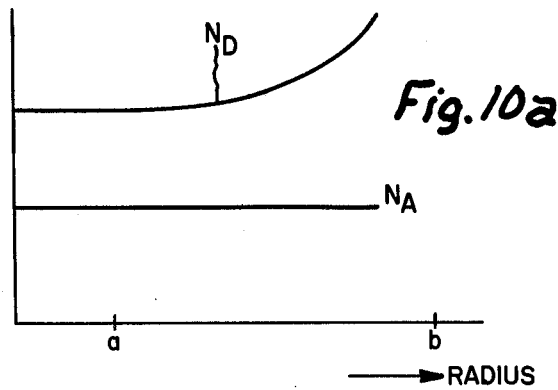
FIGS. 9a, 10a, and 11a illustrate the impurity concentrations in a germanium crystal during the manufacturing steps of FIGS. 9, 10, and 11.
Figure 11:
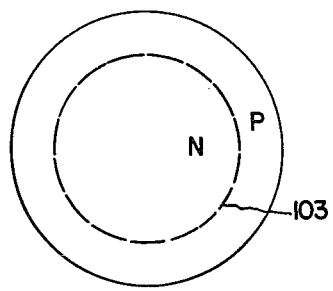
Figure 11A:
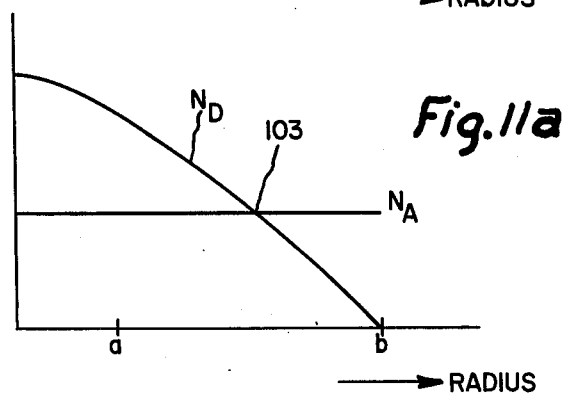
Figure 12:
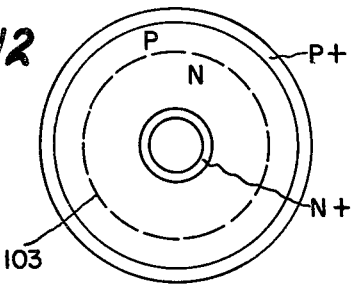
Figure 9:
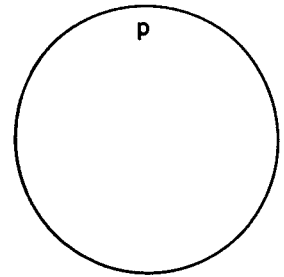
Figure 9A:
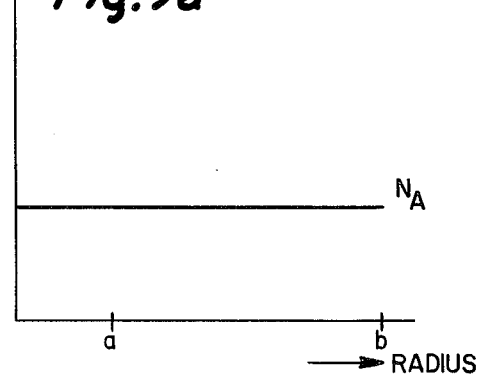

It is often difficult to obtain long rods of germanium having uniform, controlled concentrations of acceptors and lithium which are required for use in the last described process. An alternate and preferred mode for producing n-core coaxial detectors which avoids this difficulty is illustrated in FIGS. 9–12. A cylinder of high purity p-type germanium having a uniform acceptor concentration is formed in the manner discussed above with reference to p core coaxial detectors (FIGS. 9 and 9a). Lithium is then diffused into the crystal for a sufficient time to convert the conductivity of the entire crystal to n type (FIG. 10). The concentration of donor atoms in the crystal will vary as a function of the crystal radius as illustrated in FIG. 10a and its value can be easily determined by electrical measurement. The lithium is then out-diffused into a Bi-Pb alloy to create a deep p-n junction 103 in the manner indicated above (FIGS. 11 and 11a). The required out-diffusion time is readily calculated from the lithium concentration measured after the first diffusion step, to produce a junction at the desired depth. The crystal is then divided, cored, and processed to produce conventional p+ and n+ contacts (FIG. 12).

The lithium diffusion of the present method may most readily be accomplished utilizing lithium dissolved in a lead bismuth alloy. The alloy is advantageously maintained at temperatures between approximately 400° C. and approximately 600° C. Low alloy temperatures tend to increase the diffusion time beyond practical commercial limits while high alloy temperatures contribute to lattice defects and to the formation of solutions of germanium in the diffusion alloy. Lithium loss during preparation of the alloy must be minimized, for example, by first forming a eutectic mixture of approximately 20 atomic percent of Li and 80 percent Pb. A measured quantity of the Li-Pb mixture is then added to a molten Bi-Pb alloy to produce a Bi-Pb alloy with a known lithium concentration. The Li-Pb eutectic may be stored under xylene to prevent oxidation of the lithium.

Figure 13:
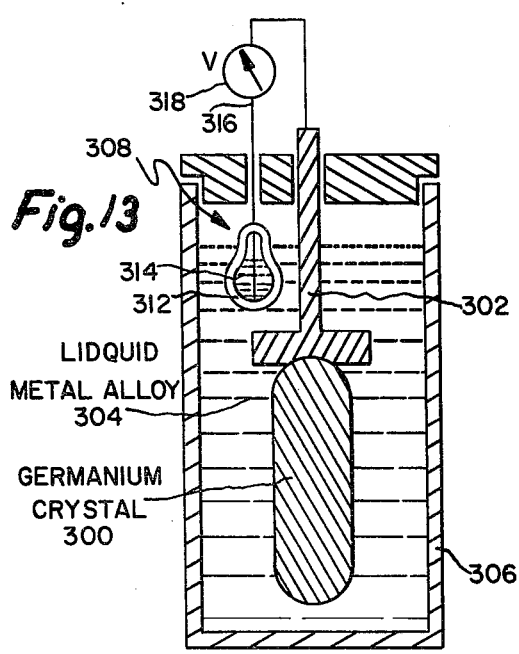
FIG. 13 illustrates apparatus for diffusing controlled quantities of lithium into a germanium crystal.

The diffusion process is most advantageously performed in the apparatus illustrated in FIG. 13. The germanium crystal 300 is supported from a metal rod 302 under the liquid metal diffusion alloy (described above) 304 within a quartz crucible 306. The lithium concentration in the Bi-Pb alloy 304 may be conveniently monitored with a half cell 308. The half cell comprises a fused quartz bulb 312 disposed in the Bi-Pb diffusion alloy 304 and contains a liquid mixture of Bi-Pb eutectic alloy with approximately 0.1 wt percent Li-Pb eutectic alloy 314. A tungsten wire 316 contacts the alloy solution 314. Lithium concentration in the Bi-Pb alloy 304 may be effectively monitored with a voltmeter 318 connected between the crystal support rod 302 and the tungsten wire 316, using the well-known formula for an electrochemical concentration cell.

EXAMPLE

An n-core coaxial germanium radiation detector having an outside radius of 2.46 cm was constructed in the following manner:

An Li-Pb eutectic alloy containing approximately 20 atomic percent lithium was added to a liquid Bi-Pb eutectic alloy at 430° C. to produce a ratio Li-Pb/Bi-Pb of $1.126 \times 10^{-4}$. A germanium rod 12 cm long, having an outside diameter of 4.92 cm and an initial acceptor concentration of $4\times 10^{10}$ acceptors cm$^{-3}$ was suspended in the liquid alloy within the apparatus of FIG. 13 for approximately 35 days. The initial voltage drop across the half cell of FIG. 13 was 113.6 mv. After the diffusion process, the half cell voltage rose to approximately 119 mv. The average donor concentration within the crystal was then determined by electrical measurement to be $12\times 10^{10}$ cm$^{-3}$.

The crystal was then immersed in a pure Bi-Pb eutectic alloy at 430° C. for approximately 13.8 days to outdiffuse lithium from the surface of the crystal. The crystal was cut to produce two rods and cored to form a hollow coaxial structure. Electrical probe measurements showed this junction to be at a radius of 1.6 cm. After etching in a conventional white etch, an internal n+ contact was formed by filling the core cavity which a solution of LiAlH$_4$ and processing for one hour at 250° C. in a nitrogen atmosphere. An external p+ contact was formed by vacuum evaporating gold onto the outer surface in a conventional manner.

The methods of the present invention allow production of germanium radiation detectors which are capable of operating with higher electric fields than prior art, commercially produced detectors. The junctions in these detectors may be positioned at will, deep within the crystal and may be constructed in coaxial, planar, or other geometries. The detectors may be stored and shipped at room temperature and will, therefore, find far wider application than prior art lithium drifted detectors.

While the invention has been described in detail herein in accordance with preferred embodiments thereof, many modifications and changes therein may be effected by those skilled in the art. Accordingly, it is intended by the appended claims to cover all such modifications and changes as fall within the true spirit and scope of this invention.

The invention claimed is:

1. A germanium radiation detector comprising:
   a hollow cylindrical germanium body having an inner region of one type conductivity, an outer region of opposite type conductivity and a p-n junction formed coaxially between said inner and said outer regions, said junction positioned so that the net excess of impurity atoms in said inner region is equal to the net excess of impurity atoms in said outer region;
   a more heavily doped region of one type conductivity extending over the inner surface of said body for providing electrical contact to said inner region; and
   a more heavily doped region of opposite type conductivity extending over the outer surface of said body for providing electrical contact to said outer region.

2. The detector of claim 1 wherein the radius of said junction is approximately 70 percent of the outside radius of said outer region.

3. The detector of claim 1 wherein said outer region comprises p-type germanium containing diffused lithium.

4. The detector of claim 3 wherein said more heavily doped region of opposite conductivity comprises lithium doped germanium.

5. The detector of claim 1 wherein said hollow cylindrical body further comprises a hermispherical end.

6. The detector of claim 1 wherein said inner region comprises p-type germanium having an excess acceptor concentration of between approximately $10^{10}$.cm$^{-3}$ and approximately $5\times 10^{10}$.cm$^{-3}$.

7. The detector of claim 2 wherein said inner region comprises p-type germanium having an excess acceptor concentration of between approximately $10^{10}$.cm$^{-3}$ and approximately $5\times 10^{10}$.cm$^{-3}$.

8. The detector of claim 1 wherein the net concentration of activator impurities at points within said body is a smooth, monotonic function of the radius of said points.

9. A germanium radiation detector comprising:
   a hollow cylindrical region of n-type germanium;
   a cylindrical region of p-type germanium disposed around and coaxial with said region of n-type germanium whereby a p-n junction is formed between said p-type germanium and said n-type germanium;
   a p+ contact disposed along the outer surface of said p-type region; and
   an n+ contact disposed along the inner surface of said n-type region.

10. The detector of claim 9 wherein the radius of said junction is approximately 70 percent of the outside radius of said region of p-type germanium.

11. The detector of claim 9 wherein the number of excess acceptor impurities in said region of said p-type germanium is approximately equal to the number of excess donor impurities in said region of said n-type germanium.

12. The detector of claim 9 wherein said n-type germanium comprises germanium containing diffused lithium.

13. The detector of claim 12 wherein said n+ contact comprises germanium doped with lithium.

14. The detector of claim 9 wherein the net concentration of activator impurities at points within said body is a smooth, monotonic function of the radius of said points.

15. A germanium radiation detector comprising:
   a first hollow cylindrical region of germanium of a first conductivity type;
   a second cylindrical region of germanium of a second conductivity type disposed around and coaxial with said first region whereby a p-n junction is formed between said first region and said second region;
   contact means disposed on the inner surface of said first region and on the outer surface of said second region which function to apply a reverse electric field in said regions and to deplete charge carriers from the volume of said regions adjoining said junction; and
   impurity atom means disposed in said regions which function to shape said electric field to a maximum value in the vicinity of said junction and to lesser values in the vicinity of said contact means.

16. The detector of claim 15 wherein said first region is p-type and said second region is n-type.

17. The detector of claim 16 wherein said impurity atom means include donor and acceptor atoms disposed within said regions and wherein the net concentration of impurity atoms at points within said regions increases as a smooth monotonic function of the radius of said points.

18. The body of claim 17 wherein said donor atoms are lithium atoms.

* * * * *